(12) United States Patent
Jung

(10) Patent No.: US 6,335,509 B1
(45) Date of Patent: Jan. 1, 2002

(54) LASER ANNEALING APPARATUS

(75) Inventor: Yun Ho Jung, Seoul (KR)

(73) Assignee: LG. Philips LCD Co., Ltd., Seoul (KR)

( * ) Notice: Subject to any disclaimer, the term of this patent is extended or adjusted under 35 U.S.C. 154(b) by 0 days.

(21) Appl. No.: 09/410,093

(22) Filed: Oct. 1, 1999

(30) Foreign Application Priority Data

Oct. 2, 1998 (KR) .................................................. 98-41610

(51) Int. Cl.$^7$ .................................................. B23K 26/067
(52) U.S. Cl. .............................. 219/121.77; 219/121.65; 219/121.8
(58) Field of Search ......................... 219/121.65, 121.66, 219/121.8, 121.77; 148/565; 438/487, 795, 799

(56) References Cited

U.S. PATENT DOCUMENTS

| | | | |
|---|---|---|---|
| 4,234,358 A | * | 11/1980 | Celler et al. |
| 5,413,958 A | * | 5/1995 | Imahashi et al. |
| 5,432,122 A | * | 7/1995 | Chae |
| 5,893,990 A | * | 4/1999 | Tanaka ........................ 219/121.8 |
| 5,897,799 A | * | 4/1999 | Yamazaki et al. ...... 219/121.75 |

FOREIGN PATENT DOCUMENTS

WO    WO94/06596    *   3/1994  .............. 219/121.66

* cited by examiner

Primary Examiner—Geoffrey S. Evans
(74) Attorney, Agent, or Firm—Long Aldridge & Norman, LLP

(57) ABSTRACT

The present invention relates to a laser annealing apparatus having a plurality of optical systems to generate a plurality of laser beams. A process time is reduced because a laser scanning operation on a large substrate is completed in a shorter time. The present invention includes a laser oscillator generating and supplying a laser, at least one beam splitter separating the laser from the laser oscillator into at least one or more laser beam, a plurality of optical systems processing a laser beam to produce laser having energy and profile sufficient to use directly for sample irradiation. The optical systems arrange each processed laser beam to a length direction.

35 Claims, 4 Drawing Sheets

MOVING DIRECTION SUBSTRATE

CRYSTALLING DIRECTION

LASER ANNEALING APPARATUS

CROSS REFERENCE TO RELATED ART

This application claims the benefit of Korean Patent Application No. 98-41610, filed on Oct. 2, 1998, which is hereby incorporated by reference.

BACKGROUND OF THE INVENTION

1. Field of Invention

The present invention relates to a laser annealing apparatus having a plurality of optical systems to generate a plurality of laser beams.

2. Discussion of Related Art

FIG. 1 shows a schematic structure of a laser annealing apparatus according to a related art. Referring to FIG. 1, a laser annealing apparatus comprises a laser oscillator 11 generating and providing a laser beam, an optical system 15 processing energy and profile of the laser beam provided by the laser oscillator 11 to be applied to a sample directly, and a laser annealing chamber (not shown in the drawing) in which various steps take place, such as directly using the laser beam processed by the optical system 15 for the sample.

The description of the operation of the laser annealing apparatus having the above constitution is as follows. (The work of irradiating a laser beam to an amorphous silicon layer is taken as an example to explain the operations of the annealing apparatus in the following description.)

First, an initial laser beam is generated by the laser oscillator 11 and is passed to the optical system 15. The initial laser beam is a non-processed and crude laser beam. The optical system 15 processes the initial laser beam into a laser beam 100 having a predetermined shaped profile and a predetermined magnitude of energy for a sample irradiation. A sample, such as an amorphous silicon layer 18 in the laser annealing chamber, is irradiated with the laser beam processed by the optical system 15.

In this case, the laser beam is applied to the amorphous silicon layer 18 with a predetermined repetition rate and the amorphous silicon layer 18 moves to one direction consecutively. Accordingly, the whole amorphous silicon layer 18 is scanned by the laser beam. The part of the amorphous silicon layer 18 which was scanned by the laser beam becomes a crystalline silicon layer due to the crystallization of the silicon.

In FIG. 1, a mirror 12 establishes a path of the laser beam. The amorphous silicon layer 18 is formed on a substrate 19.

The laser beam of the laser annealing apparatus in the related art is patterned to have a line pattern for scanning an amorphous silicon layer of a large area. A profile of the laser beam of a line pattern in the laser annealing apparatus according to related art is shown in FIG. 2.

FIG. 2 shows a plan and cross-section of a profile of a laser beam having a line pattern in a laser annealing apparatus of related art. Unfortunately, the annealing apparatus of the related art has a limit to elongate the length of the laser beam due to a single optical system. Some of the laser annealing apparatus according to a related art are unable to have a substrate of a large area irradiated with a laser beam by a single scan. Accordingly, it is difficult for the laser annealing apparatus to complete a laser scanning process as intended.

SUMMARY OF THE INVENTION

Accordingly, the present invention is directed to a laser annealing apparatus that substantially obviates one or more of the problems due to limitations and disadvantages of the related art.

The object of the present invention is to provide a laser annealing apparatus which has at least two optical systems and processes a laser beam of a wide width by having the laser beams overlap one another, wherein the laser beams are supplied from each optical system.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a laser annealing apparatus for use with a laser beam for irradiating a sample material comprises: at least one beam splitter arranged in the path of the laser beam, the beam splitter separating the laser beam into a plurality of split laser beams; and a plurality of optical systems arranged in the paths of the plurality of split laser beams, each optical system transforming an associated split laser beam into an elongated beam for irradiating the sample material, wherein the plurality of optical systems are arranged to align elongated beams in a length direction. Preferably, the beam splitter has a penetration ratio which is substantially equivalent to a reflection ratio to split the laser beam to at least two split laser beams having substantially identical energy density. The laser beam is produced from a laser oscillator, and the sample material is disposed in a laser annealing chamber.

According to one aspect of the present invention, the plurality of optical systems are arranged to allow the elongated beam from each optical system to partially overlap with each other in the length direction for irradiation the sample material. Alternatively, the plurality of optical systems may be arranged to allow the elongated beam from each optical system to be separated by a predetermined space in the length direction.

Each one of the plurality of optical systems is configured to shape the edges of the respective laser beam to have a sloped energy density region. Alternatively, each one of the plurality of optical systems may be configured to shape the edges of the respective laser beam to have a stepped energy density region. The plurality of optical systems are arranged to allow the elongated beam from each optical system to partially overlap with each other in the length direction, wherein the overlapped region of the elongated beams has substantially identical energy density as non-overlapped regions.

A method of irradiating a sample material using a laser annealing apparatus comprises the steps of: generating a laser beam; arranging at least one beam splitter in a path of the laser beam, the beam splitter separating the laser beam from the laser oscillator into a plurality of split laser beams; and arranging a plurality of optical systems in the paths of the plurality of split laser beams, each optical system transforming an associated split laser beam into an elongated beam for irradiating the sample material, wherein the plurality of optical systems are arranged to align elongated beams in a length direction.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incor- In the drawings.

DETAILED DESCRIPTION OF PREFERRED EMBODIMENTS

Reference will now be made in detail to the preferred embodiment of the present invention, an example of which is illustrated in the accompanying drawings.

Figure 1:
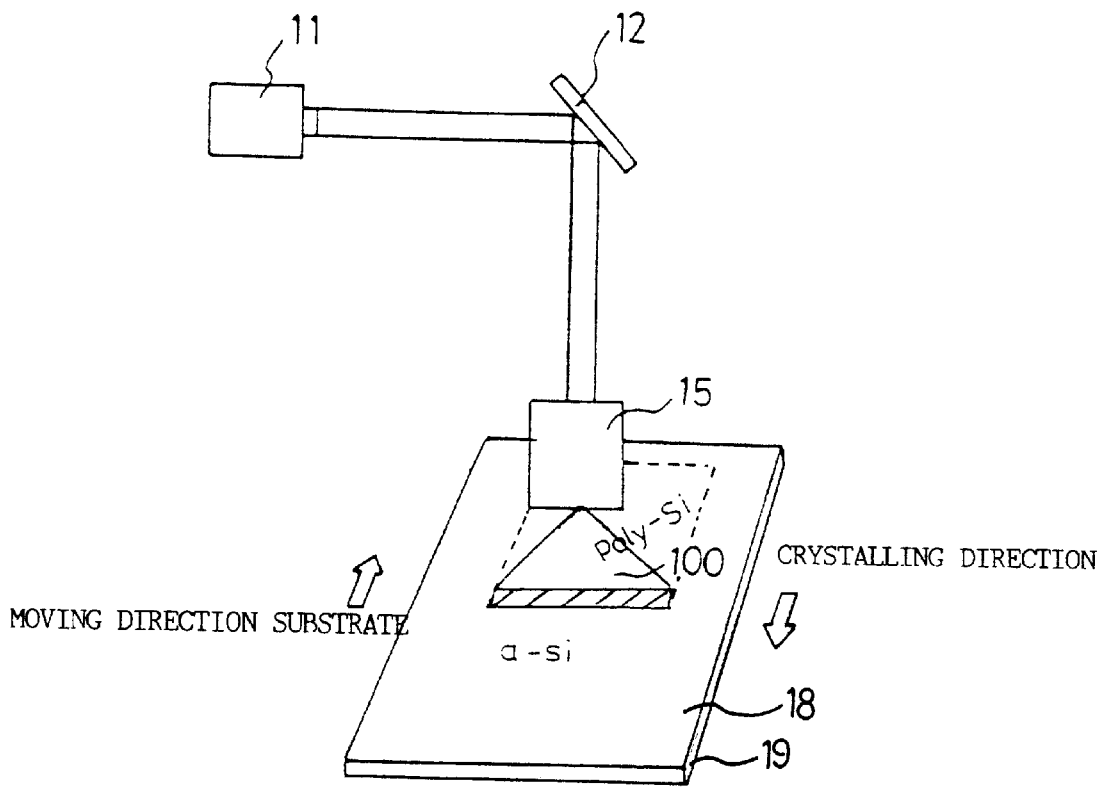
FIG. 1 shows a schematic view of a laser annealing apparatus according to related art.
Figure 2:
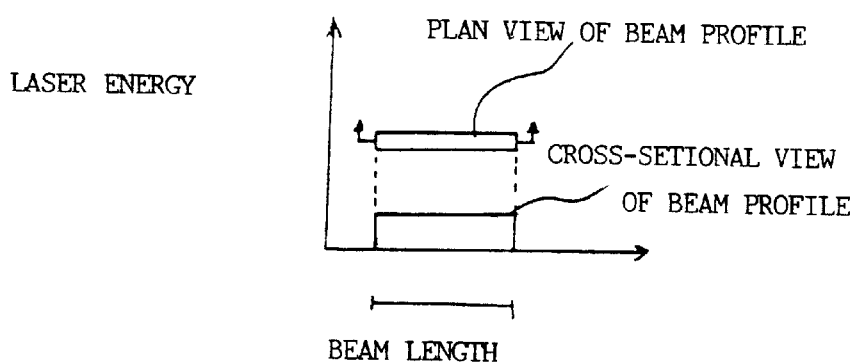
FIG. 2 shows a profile of a laser beam processed by related art.
Figure 3:
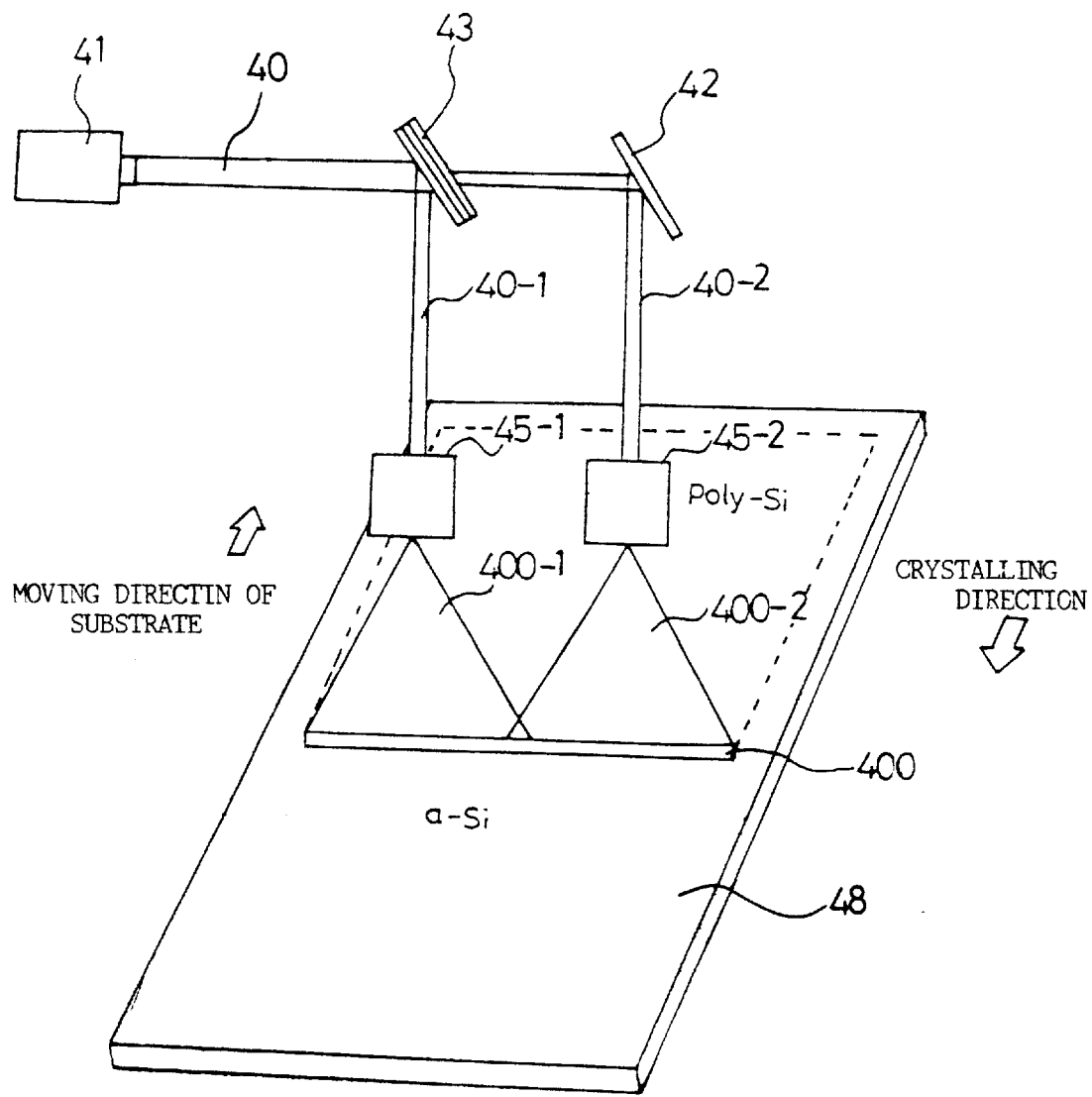
FIG. 3 shows a schematic view of a laser annealing apparatus according to a first embodiment of the present invention.

FIG. 3 shows a schematic view of a laser annealing apparatus according to a first embodiment of the present invention. A laser annealing apparatus has three major parts, which include a laser oscillator, an optical system and an annealing system. The laser annealing apparatus of the present invention splitters one initial laser beam into at least two laser beams and processes at least two laser beams by establishing at least two optical systems.

Referring to FIG. 3, the laser annealing apparatus of the present invention comprises a laser oscillator 41 generating and supplying a laser beam, a beam splitter 43 separating the laser beam generated from the laser oscillator 41 into a laser beam I 40-1 and a laser beam II 40-2, an optical system I 45-1 and an optical system II 45-2 which process energy and profiles the laser beams I 40-1 and II 40-2 to be directly applied to a sample and connect the processed laser beams 400-1 and 400-2 to each other along the length direction, and a laser annealing chamber (not shown in the drawing) in which operations are carried out such that each laser beam processed by the optical system I 45-1 and the optical system II 45-2 is directly applied to the sample.

The laser annealing apparatus is characterized by the beam splitter 43 separating laser beams and the optical systems which process the laser beams separated by the beam splitter 43 into line patterns that connect the processed laser beams to each other along the length direction in order to provide a laser beam 400 having a long-line pattern.

The operation of the above laser annealing apparatus is as follows. The process of irradiating a laser beam on an amorphous silicon layer is taken as an example to explain the operations of the annealing apparatus in the following description.

An initial laser beam 40 is formed by generating a laser from the laser oscillator 41. A laser beam I 40-1 and a laser beam II 40-2 are separated from the initial laser beam 40, having passed through the beam splitter 43. The beam splitter 43 is an apparatus for separating the initial laser beam 40 by having the initial laser beam penetrated and reflected to a certain degree. The laser beam I 40-1 reflected by the beam splitter 43 and the laser beam II 40-2 penetrating through the beam splitter 43 are shown in FIG. 3. In this case, characteristics and intensity of the laser beam I 40-1 is similar to that of the laser beam II 40-2 produced by the beam splitter 43, which makes a penetration ratio equivalent to a reflection ratio.

The laser beam I 40-1 is sent to the optical system I 45-1. Then the optical system I 45-1 processes the laser beam I 40-1 into a laser beam I 400-1, having predetermined energy and a profile of line pattern for sample irradiation. With the same method, the laser beam II 40-2 is sent to the optical system II 45-2 and then processed to become a laser beam II 400-2 which is similar in physical shape and intensity irradiation as the laser beam I 400-1. In this case, the optical system I 45-1 and the optical system II 45-2 preferably have identical structures to provide the same energy and beam profiles of the laser beam I 400-1 and the laser beam II 400-2.

The amorphous silicon layer 48 in the laser annealing chamber is irradiated with the laser beam I 400-1 and the laser beam II 400-2 for sample irradiation which have been processed by the optical system I 45-1 and the optical system II 45-2. The optical system I 45-1 and the optical system II 45-2 are arranged to provide a laser beam 400 having a long-line shape by means of processing the laser beams I 40-1 and II 40-2 to have a contiguous line shape and connecting the processed laser beams to each other along the length direction.

Figure 4:
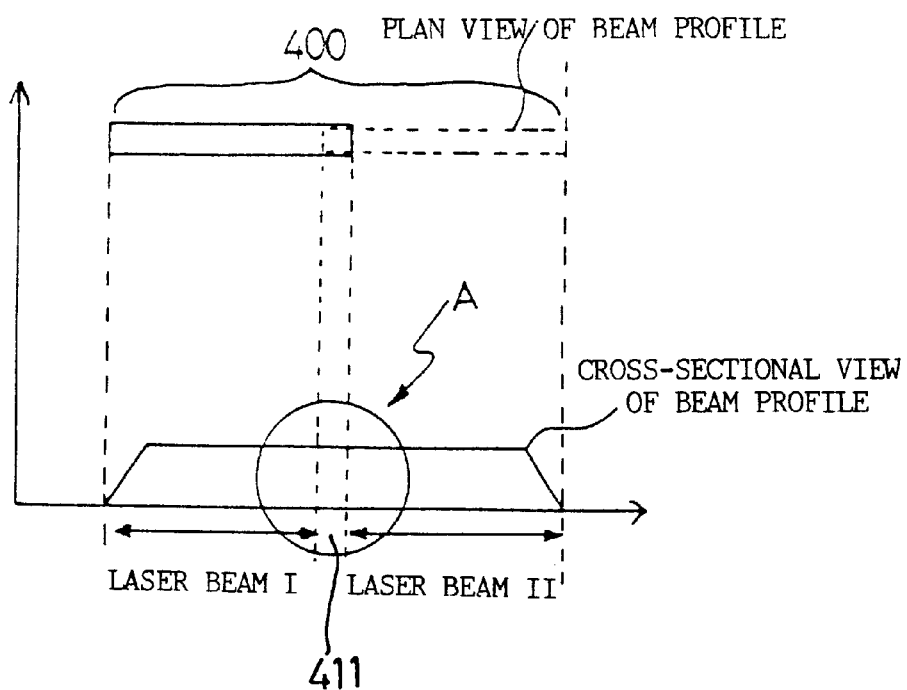
FIG. 4 shows a beam profile when two laser beams processed by the present invention are overlapping each other.

FIG. 4 shows a beam profile of a long-line pattern when the two laser beams I and II processed by the present invention are properly overlapped with each other. Referring to FIG. 4, when two laser beams are overlapped, it is important to make the energy of the overlapped region 411 maintain that of the rest of the region. The laser beam is applied to the amorphous silicon layer 48 with a predetermined repetition rate and the amorphous silicon layer 48 moves to one direction. Accordingly, the whole amorphous silicon layer 48 is scanned by the laser beam.

Figure 5:
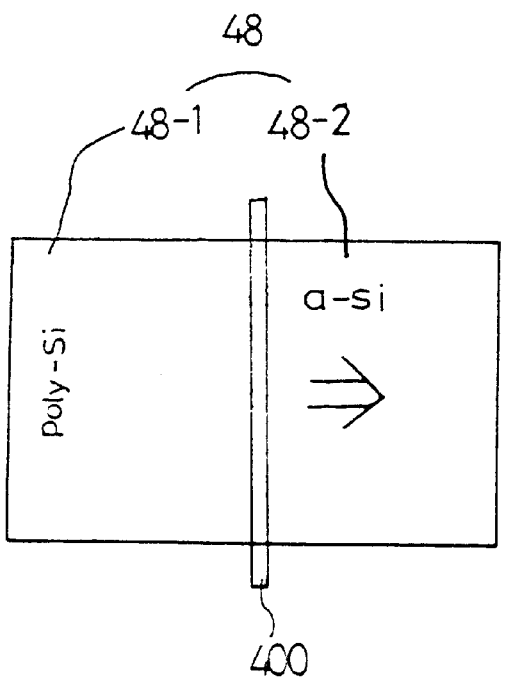
FIG. 5 shows a laser beam scanning process according to the present invention.

In order to scan an amorphous silicon layer 48 having a large area, the laser annealing apparatus of the present invention provides a laser beam of a long-line type as shown in FIG. 4 by means of processing the laser beams I and II into line patterns and connecting the processed laser beams to each other along the length direction. Then, as shown in FIG. 5, the whole surface of the substrate of large area is irradiated by a single scan.

After the laser crystallization is achieved, a polycrystalline silicon layer 48-1 is formed. The reference numeral 48-2 represents amorphous silicon region which has not yet been crystallized by a laser.

The overlapped part of the laser beam is designated by "A" in FIG. 4. Enlarged views of the designated sign of "A" are shown in FIGS. 6 and 7.

Figure 6:
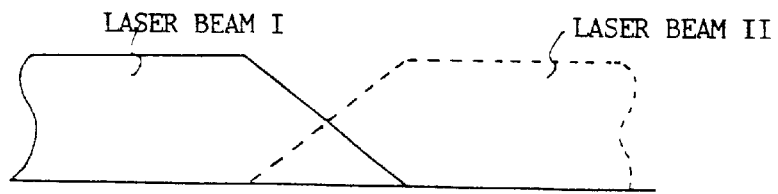
FIG. 6 shows a first example of laser beams overlapping each other according to the present invention.
Figure 7:
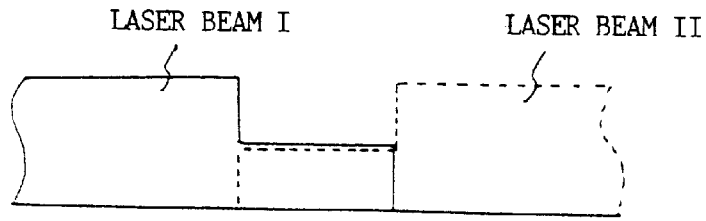
FIG. 7 shows a second example of laser beams overlapping each other according to the present invention.

FIG. 6 shows a first example of overlapping laser beams according to the present invention. Referring to FIG. 6, each of a laser beam I (a straight line) and a laser beam II (a dotted line) preferably has the same energy and profile. Each laser beam is formed to have a line pattern having a first energy level.

Generally, the part where the laser beams overlap each other has strengthened energy due to overlapping the two energies of the two laser beams. Accordingly, it is important for the energy-strengthened part (due to overlapping the two laser beams to each other) to have and maintain the same energy as the non-overlapping part.

In the first example, the sloped edges of the profiles of the two laser beams overlap each other. The laser beams I and II overlap each other to make the sloped overlapped region to have the first energy level, which is the same energy as the rest of the nonoverlapped regions. Because of the overlapped characteristics, the energy in the overlapped region is increased to match that of the nonoverlapped regions.

FIG. 7 shows a second example of overlapping laser beams according to the present invention. Referring to FIG. 7, a laser beam I (a straight line) and a laser beam II (a dotted line) have the same energy and profiles. Each laser beam is formed to have a line pattern having a first energy level, but the energy at the edge of the beam profile has a second energy level lower than the first energy level.

In the second example, the edges of the profiles of the two laser beams overlap each other. The laser beams I and II overlap each other to make the overlapped region to have the first energy level, which is the same energy as the rest of the nonoverlapped regions. Because of the overlapped characteristics, the energy in the overlapped region is increased to match that of the nonoverlapped regions.

Figure 8:
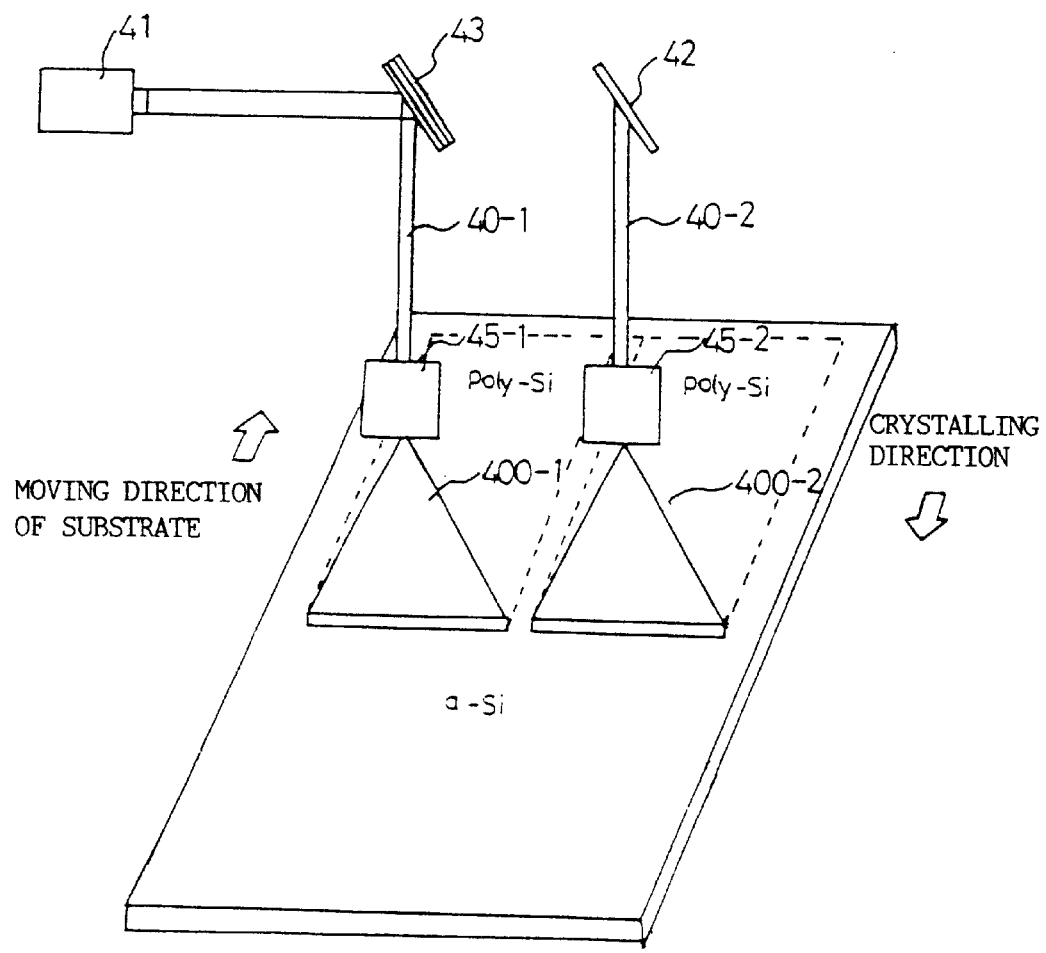
FIG. 8 shows a schematic view of a laser annealing apparatus according to a second embodiment of the present invention

FIG. 8 shows a schematic view of a laser annealing apparatus according to a second embodiment of the present invention. In the above-mentioned first embodiment of the present invention, a substrate having a large area is scanned by a long laser beam formed by overlapping two laser beams to each other. In the second embodiment of the present invention, two laser beams are directly applied to a substrate without being overlapped.

Having been formed by generating a laser from a laser oscillator 41, an initial laser beam 40 passes through a beam splitter 43 to be separated into a laser beam I 40-1 and a laser beam II 40-2. Then, laser beams are applied to a sample by an optical system I 45-1 and an optical system II 45-2. A method of processing laser beams is the same as the method in the first embodiment of the present invention.

Scanning operations on the substrate are carried out simultaneously, wherein the laser beam I and the laser beam II (which have been processed by the optical system I 45-1 and the optical system II 45-2) lie in parallel to the substrate. As this case is applied to an operation of scanning selected parts of the substrate instead of scanning the whole substrate, process time is reduced.

In the above-explained embodiments of the present invention, a laser beam is divided into two laser beams by a beam splitter 43, and two laser beams for sample irradiation are processed by two optical systems 45-1 and 45-2.

The present invention is also applied to another embodiment such that a laser beam is divided into a plurality of laser beams by a plurality of beam splitters, and a plurality of laser beams for sample irradiation are processed by a plurality of optical systems. In this case, a plurality of optical systems, which enables the formation of at least one long laser beam, are constructed.

A laser annealing apparatus according to the present invention enables the use of a plurality of laser beams processed by a plurality of optical systems. Accordingly, process time is reduced due to performing a laser scanning operation on a substrate having a large area in a short time.

It will be apparent to those skilled in the art that various modifications and variations can be made in a laser annealing apparatus of the present invention without departing from the spirit or scope of the inventions. Thus, it is intended that the present invention covers the modifications and variations of this invention, provided they come within the scope of the appended claims and equivalents.

What is claimed is:

1. A laser annealing apparatus for use with a laser beam for irradiating a sample material, comprising:
   at least one beam splitter arranged in the path of the laser beam, the beam splitter separating the laser beam into a plurality of split laser beams; and
   a plurality of optical systems arranged in the paths of the plurality of split laser beams, each optical system transforming an associated split laser beam into an elongated beam for irradiating the sample material, wherein the plurality of optical systems are arranged to align elongated beams in a length direction.

2. The laser annealing apparatus of claim 1, wherein the laser beam is produced from a laser oscillator.

3. The laser annealing apparatus of claim 1, wherein the sample material is disposed in a laser annealing chamber.

4. The laser annealing apparatus of claim 1, wherein the plurality of optical systems are arranged to allow the elongated beam from each optical system to partially overlap with each other in the length direction for irradiation the sample material.

5. The laser annealing apparatus of claim 4, wherein the plurality of optical systems are arranged to allow the elongated beam from each optical system to partially overlap with each other in the length direction, wherein the overlapped region of the elongated beams has substantially identical energy density as non-overlapped regions.

6. The laser annealing apparatus of claim 4, wherein the beam splitter has a penetration ratio which is substantially equivalent to a reflection ratio to split the laser beam to at least two split laser beams having substantially identical energy density.

7. The laser annealing apparatus of claim 4, wherein each one of the plurality of optical systems is configured to shape the edges of the respective laser beam to have a sloped energy density region.

8. The laser annealing apparatus of claim 4, wherein each one of the plurality of optical systems is configured to shape the edges of the respective laser beam to have a stepped energy density region.

9. The laser annealing apparatus of claim 1, wherein the plurality of optical systems are arranged to allow the elongated beam from each optical system to be separated by a predetermined space in the length direction.

10. The laser annealing apparatus of claim 9, wherein the beam splitter has a penetration ratio which is substantially equivalent to a reflection ratio to split the laser beam to at least two split laser beams having substantially identical energy density.

11. The laser annealing apparatus of claim 9, wherein each one of the plurality of optical systems is configured to shape the edges of the respective laser beam to have a sloped energy density region.

12. The laser annealing apparatus of claim 9, wherein each one of the plurality of optical systems is configured to shape the edges of the respective laser beam to have a stepped energy density region.

13. The laser annealing apparatus of claim 1, wherein the beam splitter has a penetration ratio which is substantially equivalent to a reflection ratio to split the laser beam to at least two split laser beams having substantially identical energy density.

14. The laser annealing apparatus of claim 1, wherein each one of the plurality of optical systems is configured to shape the edges of the respective laser beam to have a sloped energy density region.

15. The laser annealing apparatus of claim 1, wherein each one of the plurality of optical systems is configured to shape the edges of the respective laser beam to have a stepped energy density region.

16. A laser annealing apparatus for use with a laser beam for irradiating a sample material, comprising:
   at least one beam splitter means arranged in the path of the laser beam for separating the laser beam into a plurality of split laser beams; and
   a plurality of optical system means arranged in the paths of the plurality of split laser beams, each optical system transforming an associated split laser beam into an elongated beam for irradiating the sample material, wherein the plurality of optical systems are arranged to align elongated beams in a length direction.

17. The laser annealing apparatus of claim 16, wherein the plurality of optical system means are arranged to allow the elongated beam from each optical system to partially overlap with each other in the length direction for irradiation the sample material.

18. The laser annealing apparatus of claim 17, wherein the plurality of optical system means are arranged to allow the elongated beam from each optical system mean to partially overlap with each other in the length direction, wherein the overlapped region of the elongated beams has substantially identical energy density as non-overlapped regions.

19. The laser annealing apparatus of claim 16, wherein the beam splitter means has a penetration ratio which is substantially equivalent to a reflection ratio to split the laser beam to at least two split laser beams having substantially identical energy density.

20. The laser annealing apparatus of claim 16, wherein each one of the plurality of optical system means are configured to shape the edges of the respective laser beam to have a sloped energy density region.

21. The laser annealing apparatus of claim 16, wherein each one of the plurality of optical system means is configured to shape the edges of the respective laser beam to have a stepped energy density region.

22. The laser annealing apparatus of claim 16, wherein the plurality of optical system means are arranged to allow the elongated beam from each optical system to be separated by a predetermined space in the length direction.

23. A method of irradiating a sample material using a laser annealing apparatus, comprising the steps of:
   generating a laser beam;
   arranging at least one beam splitter in a path of the laser beam, the beam splitter separating the laser beam into a plurality of split laser beams; and
   arranging a plurality of optical systems in the paths of the plurality of split laser beams, each optical system transforming an associated split laser beam into an elongated beam for irradiating the sample material, wherein the plurality of optical systems are arranged to align elongated beams in a length direction.

24. The method of claim 23, wherein the plurality of optical systems are arranged to allow the elongated beam from each optical system to partially overlap with each other in the length direction for irradiation the sample material.

25. The method of claim 24, wherein the plurality of optical systems are arranged to allow the elongated beam from each optical system to partially overlap with each other in the length direction, wherein the overlapped region of the elongated beams has substantially identical energy density as non-overlapped regions.

26. The method of claim 24, wherein the beam splitter has a penetration ratio which is substantially equivalent to a reflection ratio to split the laser beam to at least two split laser beams having substantially identical energy density.

27. The method of claim 24, wherein each one of the plurality of optical systems is configured to shape the edges of the respective laser beam to have a sloped energy density region.

28. The method of claim 24, wherein each one of the plurality of optical systems is configured to shape the edges of the respective laser beam to have a stepped energy density region.

29. The method of claim 23, wherein the plurality of optical systems are arranged to allow the elongated beam from each optical system to be separated by a predetermined space in the length direction.

30. The method of claim 29, wherein the beam splitter has a penetration ratio which is substantially equivalent to a reflection ratio to split the laser beam to at least two split laser beams having substantially identical energy density.

31. The method of claim 29, wherein each one of the plurality of optical systems is configured to shape the edges of the respective laser beam to have a sloped energy density region.

32. The method of claim 29, wherein each one of the plurality of optical systems is configured to shape the edges of the respective laser beam to have a stepped energy density region.

33. The method of claim 23, wherein the beam splitter has a penetration ratio which is substantially equivalent to a reflection ratio to split the laser beam to at least two split laser beams having substantially identical energy density.

34. The method of claim 23, wherein each one of the plurality of optical systems is configured to shape the edges of the respective laser beam to have a sloped energy density region.

35. The method of claim 23, wherein each one of the plurality of optical systems is configured to shape the edges of the respective laser beam to have a stepped energy density region.

* * * * *